United States Patent

(12) United States Patent
Dennis

(10) Patent No.: US 6,812,058 B2
(45) Date of Patent: Nov. 2, 2004

(54) REFERENCE DATA CODING IN SOLID STATE IMAGE SENSORS

(75) Inventor: Carl Dennis, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 138 days.

(21) Appl. No.: 10/072,460

(22) Filed: Feb. 7, 2002

(65) Prior Publication Data

US 2002/0114526 A1 Aug. 22, 2002

(30) Foreign Application Priority Data

Feb. 8, 2001 (EP) .............................. 01301123

(51) Int. Cl.$^7$ ..................... H01L 31/66; H04N 5/235; G06K 9/36
(52) U.S. Cl. ..................... 438/57; 438/22; 438/23; 438/24; 438/70; 438/69; 438/66; 438/462; 348/222; 348/259; 348/268; 348/273; 348/272; 348/342; 348/219; 382/232; 382/303; 382/261; 382/162; 382/166; 382/300; 382/305
(58) Field of Search ..................... 438/57, 70, 87, 438/30, 69, 75, 22, 23, 24, 48, 81, 462, 66; 348/222, 259, 268, 273, 272, 342; 382/232, 167, 162, 154, 300, 312, 261, 161, 303, 305

(56) References Cited

U.S. PATENT DOCUMENTS 5,353,061 A * 10/1994 Rodriguez et al. .......... 348/409
6,140,996 A * 10/2000 Nobutani et al. .......... 345/856

FOREIGN PATENT DOCUMENTS

JP  5164914  6/1993  .......... G02B/5/20
WO  9950914  10/1999  .......... H01L/31/18

OTHER PUBLICATIONS

Low Resolution Digital CMOS Image Sensor, Vision VV6300, VLSI Vision Limited, Apr. 3, 1998.*
Patent Abstracts of Japan, vol. 006, No. 243 (E–145) Dec. 2, 1982 & JP 57141850A (Hitachi Seisakusho KK), Sep. 2, 1982.
Patent Abstracts of Japan, vol. 012, No. 323 (P–752) Sep. 2, 1988 & JP 63085704A (Toppan Printing Co. Ltd.), Apr. 16, 1988.
Patent Abstracts of Japan, vol. 013, No. 389 (P–925) Aug. 29, 1989 & JP 01137201A (Toppan Printing Co. Ltd.), May 30, 1989.
Patent Abstracts of Japan, vol. 1999, No. 09, Jul. 30, 1999 & JP 11101907A (Dainippon Printing Co. Ltd.), Apr. 13, 1999.
Patent Abstracts of Japan, vol. 1999, No. 09, Jul. 30, 1999 & JP11119204A (Toray Ind. Inc), Apr. 30, 1999.

* cited by examiner

Primary Examiner—Matthew Smith
Assistant Examiner—Igwe U. Anya
(74) Attorney, Agent, or Firm—Lisa K. Jorgenson; Allen, Dyer, Doppelt, Milbrath & Gilchrist, P.A.

(57) ABSTRACT

Data is encoded in a solid state image sensor that includes a sensor pixel array by varying the color processing applied to at least some of the border pixels of the sensor pixel array. Data may be encoded in the color processing by varying the pattern of a color filter mosaic and by varying a pattern of a microlens array in accordance with a predetermined scheme. This scheme includes omission of color filter material and omission of the microlens array from selected pixels. The data, typically encoded in a binary format, is read by illuminating the sensor pixel array and by processing the output signals from the border pixels. The encoded data may include color process codes, mask revision codes and product codes.

29 Claims, 2 Drawing Sheets

REFERENCE DATA CODING IN SOLID STATE IMAGE SENSORS

FIELD OF THE INVENTION

The present invention relates to solid state image sensors, and more particularly, to encoding data in a solid state image sensor. The invention may be used for encoding any type of reference data, but is particularly useful for recording color processes and mask revision codes.

BACKGROUND OF THE INVENTION

Recording reference data on a variety of types of microchips, including solid state image sensors, during manufacture of the chips is well known. Such data may include product codes and the like, and may be encoded in the chip circuitry using a variety of coding schemes. In the case of an image sensor, such reference data may identify the particular type of the basic sensor chip, for example.

However, the same basic sensor chip may provide the basis for a variety of different image sensors which differ in terms of the color processing applied to the basic sensor chip. The details of the color processing determine the characteristics of the color filter mosaic and microlens array applied to the chip, for example. It is not practical to record such data in the chip circuitry during manufacture of the basic sensor chip since the details of the subsequent color processing may not be known at the time of manufacture of the basic sensor chip.

Solid state image sensors generally comprise an array of light sensitive elements (pixels) arranged in rows and columns, together with associated circuitry for reading signals from the pixel array. All of the pixels of the array are connected to the associated circuitry and are capable of being read, but a number (typically two to eight) of the rows and columns of pixels around the periphery of the pixel array are not actually used in the image signals output from the sensor. These unused pixels are commonly referred to as border pixels.

SUMMARY OF THE INVENTION

In view of the foregoing background, an object of the present invention is to store reference data in a solid state image sensor.

This and other objects, advantages and features in accordance with the present invention are provided by a method of encoding data in a solid state image sensor comprising an array of pixels. The method preferably comprises applying color processing to the array of pixels, with the array of pixels comprising a plurality of border pixels. The method preferably further comprises varying the color processing applied to the plurality of border pixels for encoding data therein.

In one approach for the color processing, the color processing is applied by applying a color filter mosaic to the array of pixels. The color processing is varied by varying a pattern of the color filter mosaic applied to the plurality of border pixels. The color filter mosaic may comprise color filter material, and variation of the pattern of the color filter mosaic comprises removing the color filter material from selected border pixels. The color filter mosaic may also comprise a plurality of color filter layers, and variation of the pattern of the color filter mosaic comprises applying the plurality of color filter layers to selected border pixels.

The color filter mosaic may comprise a Bayer pattern color filter mosaic that is based upon a plurality of color filter elements. Variation of the pattern of the color filter mosaic comprises encoding one bit of binary data in two adjacent blocks of four pixels of the Bayer pattern color filter mosaic by varying the color filter elements applied to one pixel of one of the two adjacent blocks.

In another approach for the color processing, the color processing is applied by applying a microlens array to the array of pixels. Variation of the color processing comprises varying a pattern of the microlens array applied to the plurality of border pixels.

The method according to the present invention advantageously allows reference data to be encoded in the border pixels instead of within the chip circuitry. It is not practical to record such data in the chip circuitry during manufacture of an image sensor since the details of the subsequent color processing may not be known at the time of manufacture. The encoded data may include a color process code, a mask revision code, a product code, and at least one of a start code and an end code.

Another aspect of the invention is directed to a method of reading data encoded in a solid state image sensor comprising an array of pixels. The data has been encoded in the solid state image sensor by applying color processing to the array of pixels, with the array of pixels comprising a plurality of border pixels, and by varying the color processing applied to the plurality of border pixels for encoding the data therein. The method comprises illuminating the array of pixels, and processing signals output from the plurality of border pixels, with the signals corresponding to the encoded data.

Yet another aspect of the present invention is directed to a solid state image sensor system comprising an array of pixels comprising a plurality of border pixels, with the plurality of border pixels having data encoded therein by color processing.

BRIEF DESCRIPTION OF THE DRAWINGS

Embodiments of the invention will now be described, by way of example only, with reference to the accompanying drawings, in which.

DETAILED DESCRIPTION OF THE PREFERRED EMBODIMENTS

Figure 1:
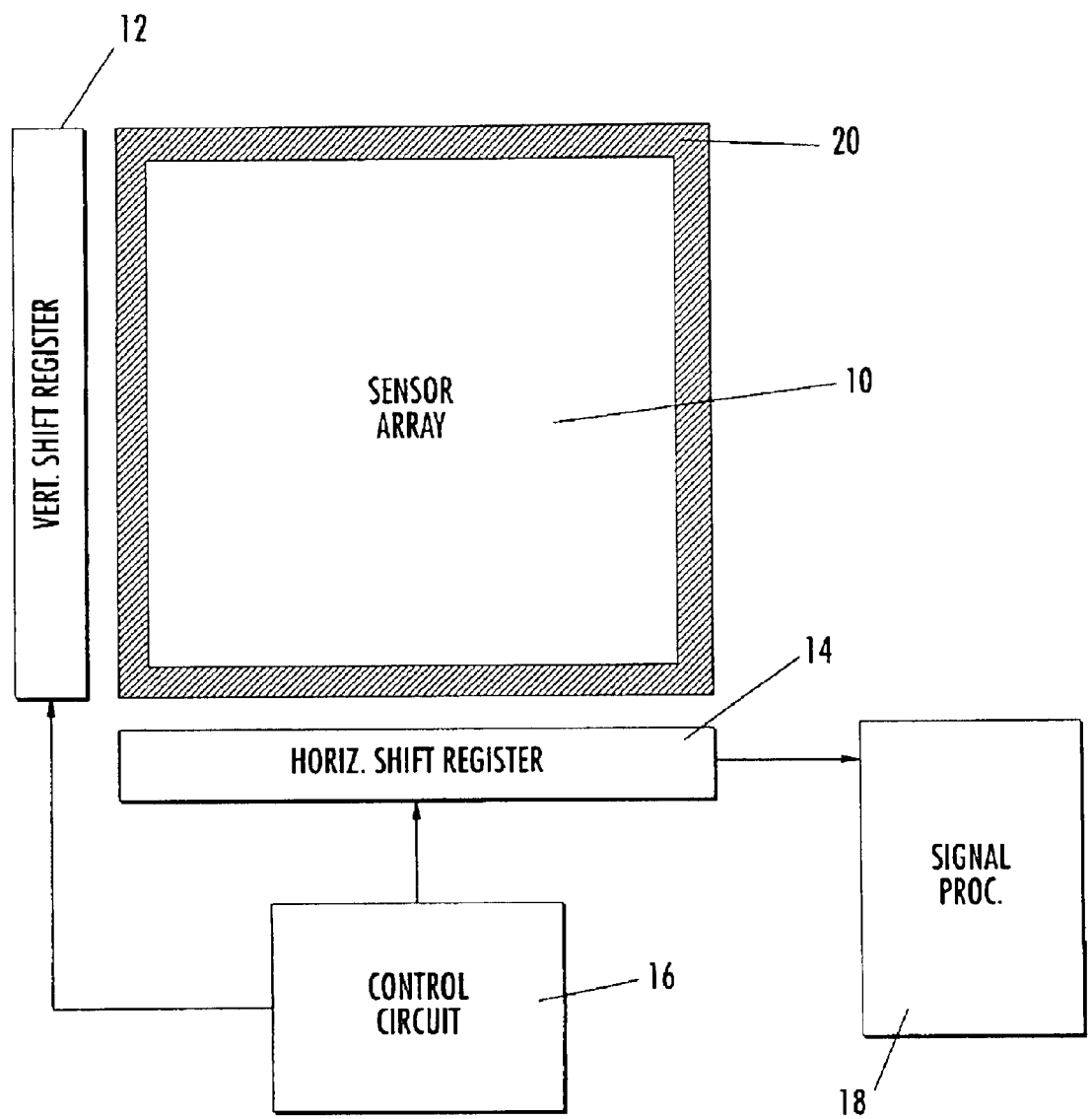
FIG. 1 is a schematic block diagram illustrating a generic solid state image sensor or image sensing system according to the prior art.

Referring now to the drawings, FIG. 1 shows a generic solid state image sensor/sensing system that includes a sensor array 10, and vertical and horizontal shift registers 12 and 14 used for reading output signals from the sensor array. The sensor array 10 comprises an array of photosensitive pixels arranged in lines and columns. The image sensor/sensing system further includes control means 16 for controlling the operation of the shift registers 12, 14, and signal processing means 18 for processing image signals from the array 10, which are output via the horizontal shift register 14.

The arrangement of the sensor as described thus far is generic for a variety of conventional image sensors and will not be described in further detail. It will be understood that the control means 16 and signal processing means 18 may be implemented in hardware, firmware or software and may be integrated on-chip with the sensor array 10, or located off-chip, locally or remotely, or combinations thereof.

Generally speaking, the input to the signal processing means 18 will be analog. The signal processing means may include analog-digital conversion means, digital signal processing means for a performing any of a variety of signal processing functions as are well known in the art, and storage means for storing one or more images and/or portions of images for a variety of purposes.

As is well known in the art, the pixels of a number of rows and columns around the periphery of the pixel array 10, typically two to eight rows/columns, are designated as border pixels, indicated by reference numeral 20 in FIG. 1. The border pixels are fully functional pixels but, in normal use of the sensor, they are either not read or their output signals are ignored. That is, their outputs do not form part of the image signal produced by the sensor.

It is known to encode data, such as product codes, in the electronic circuitry of the basic sensor chip during manufacture thereof. As is also well known in the art, a color image sensor is produced by applying color processing to a basic sensor chip of the type described above. Typically, color processing involves the application of a color filter mosaic to the pixel array 10. Color processing may also include the application of a microlens array on top of the color filter mosaic to improve the light gathering capacity of the pixels.

The color filter mosaic may have any of a variety of well known configurations, using a variety of different color combinations. These color combinations typically include three primary colors such as red, green and blue or complementary colors such as cyan, magenta and yellow to produce a full color image output from the sensor. One example of a color filter pattern is the well known Bayer pattern, in which the pixels of the basic array 10 are grouped in blocks of four, with the pixels at two diagonally opposite corners of each block being colored green and the remaining two pixels being colored red and blue respectively.

It is common for a number of different color processes having different parameters to be applied to basic sensor chips of the same type. It is also common for different versions (revisions) of a color process mask to be used. It is useful for the sensor to have information recorded thereon regarding the color process applied and/or mask revision used on that particular sensor. It is not practical to encode such data in the circuitry of the basic chip during manufacture thereof.

In accordance with the present invention, data is encoded in the color processing applied to at least some of the border pixels of the basic sensor chip. The recorded data may be read during manufacture of the sensor, subsequent assembly of an imaging system using the sensor, or subsequent use of the sensor.

Figure 2:
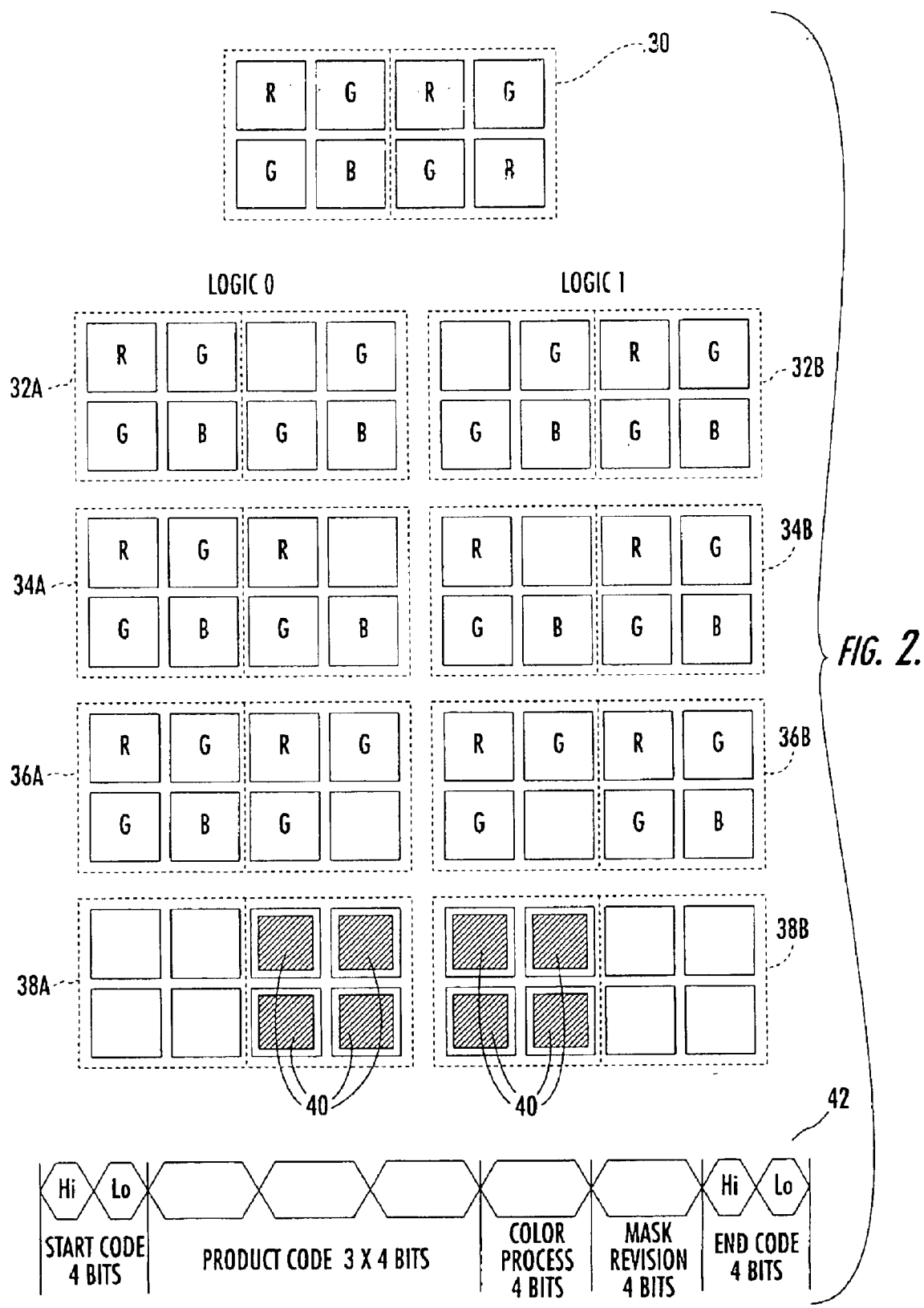
FIG. 2 is a diagram illustrating an embodiment of a data coding scheme in accordance with the present invention.

FIG. 2 illustrates a preferred example of a data encoding scheme in accordance with the invention. At 30 there are shown two adjacent blocks of four pixels of a standard Bayer pattern color filter mosaic, with each block including two green pixels G, a red pixel R and a blue pixel B as described above. Binary data can be encoded in the color filter mosaic applied to the border pixels as logic 0s and logic 1s as shown at 32A and 32B, 34A and 34B, and 36A and 36B respectively.

In this example, a logic 0 is encoded at 32A by omitting the red color filter element from the right hand block, and a logic 1 is encoded at 32B by omitting the red color filter element from the left hand block. When the sensor is illuminated by incident light and signals are read out from the relevant pixels, it is possible to discriminate between a signal from a pixel having a color filter element and a pixel with no color filter element. The manner in which such signals may be discriminated is well known in the art (e.g., from error detection algorithms used in conventional image sensors) and will not be described in detail herein.

It will be understood that binary data may be encoded in the color processing by varying the color processing applied to individual border pixels in any way which may be discriminated when signals are read out from the pixels. This may be done by omission of any one color element or combinations of color elements. Alternatively, instead of omitting a color element, multiple colors may be applied to the same pixel, making the filter element substantially or completely opaque.

References 34A/B shows a logic 0 and logic 1 encoded by omission of green filter elements, while references 36A/B shows a logic 0 and logic 1 encoded by omission of blue filter elements. Red, green and blue coding of the type illustrated may be combined in the same color filter mosaic.

Alternatively or in addition to encoding data in the color filter mosaic pattern, data may be encoded in the microlens array applied to the sensor. This is illustrated at 38A and 38B, where a logic 0 is encoded by omitting microlenses 40 from the left hand block of pixels, and a logic 1 is encoded by omitting microlenses 40 from the right hand block of pixels.

Any type of data may be encoded using the method of the present invention. However, the invention is particularly intended for encoding color process information and/or mask revision information, preferably in combination with a product code. The relevant information requires a relatively small number of bits. An example is illustrated at 42 in FIG. 2, where the data comprises a start code of 4 bits (one nibble), a product code comprising three nibbles (3×4 bits), a color process code of four bits, a mask revision code of four bits and an end code of 4 bits. This data is easily accommodated in the number of border pixels available in a typical image sensor.

It will be understood that the coding scheme may vary from the illustrated examples, and may be adapted for use with any type of color filter mosaic or microlens array. The data encoded in the color processing may be read at any time during the life of the sensor by illuminating the sensor and interpreting the output from the border pixels.

Algorithms for reading the data may be incorporated in the sensor or sensor system or may be provided separately from the sensor/system. Preferably, the sensor or system circuitry is provided with storage means for electronically storing the data read from the border pixels so that the data is available for use by signal processing algorithms during subsequent use of the image sensor/system. Improvements and modifications may be incorporated without departing from the scope of the invention.

That which is claimed is:

1. A method of encoding data in a solid state image sensor, the method comprising:

applying color processing to the array of pixels, with the array of pixels comprising a plurality of border pixels; and varying the color processing applied to the plurality of border pixels for encoding data therein.

2. A method according to claim 1, wherein applying the color processing comprises applying a color filter mosaic to the array of pixels; and wherein varying the color processing comprises varying a pattern of the color filter mosaic applied to the plurality of border pixels.

3. A method according to claim 2, wherein the color filter mosaic comprises color filter material; and wherein varying the pattern of the color filter mosaic comprises removing the color filter material from selected border pixels.

4. A method according to claim 2, wherein the color filter mosaic comprises a plurality of color filter layers; and wherein varying the pattern of the color filter mosaic comprises applying the plurality of color filter layers to selected border pixels.

5. A method according to claim 2, wherein the color filter mosaic comprises a Bayer pattern color filter mosaic based upon a plurality of color filter elements; and wherein varying the pattern of the color filter mosaic comprises encoding one bit of binary data in two adjacent blocks of four pixels of the Bayer pattern color filter mosaic by varying the color filter elements applied to one pixel of one of the two adjacent blocks.

6. A method according to claim 1, wherein applying the color processing comprises applying a microlens array to the array of pixels; and wherein varying the color processing comprises varying a pattern of the microlens array applied to the plurality of border pixels.

7. A method according to claim 1, wherein the encoded data includes a color process code.

8. A method according to claim 1, wherein the encoded data includes a mask revision code.

9. A method according to claim 1, wherein the encoded data includes a product code.

10. A method according to claim 1, wherein the encoded data includes at least one of a start code and an end code.

11. A method of encoding data in a solid state image sensor, the method comprising:

applying color processing to the array of pixels using a color filter mosaic, with the array of pixels comprising a plurality of border pixels; and varying a pattern of the color filter mosaic for varying the color processing applied to the plurality of border pixels for encoding data therein.

12. A method according to claim 11, wherein the color filter mosaic comprises color filter material; and wherein varying the pattern of the color filter mosaic comprises removing the color filter material from selected border pixels.

13. A method according to claim 11, wherein the color filter mosaic comprises a plurality of color filter layers; and wherein varying the pattern of the color filter mosaic comprises applying the plurality of color filter layers to selected border pixels.

14. A method according to claim 11, wherein the color filter mosaic comprises a Bayer pattern color filter mosaic based upon a plurality of color filter elements; and wherein varying the pattern of the color filter mosaic comprises encoding one bit of binary data in two adjacent blocks of four pixels of the Bayer pattern color filter mosaic by varying the color filter elements applied to one pixel of one of the two adjacent blocks.

15. A method according to claim 11, wherein the encoded data includes at least one of a color process code, a mask revision code, a product code, a start code and an end code.

16. A method of encoding data in a solid state image sensor, the method comprising:

applying color processing to the array of pixels using a microlens array, with the array of pixels comprising a plurality of border pixels; and varying a pattern of the microlens array for varying the color processing applied to the plurality of border pixels for encoding data therein.

17. A method according to claim 15, wherein the encoded data includes at least one of a color process code, a mask revision code, a product code, a start code and an end code.

18. A method of reading data encoded in a solid state image sensor comprising an array of pixels, the data being encoded by applying color processing to the array of pixels with the array of pixels comprising a plurality of border pixels, and by varying the color processing applied to the plurality of border pixels for encoding the data therein, the method comprising:

illuminating the array of pixels; and processing signals output from the plurality of border pixels, with the signals corresponding to the encoded data.

19. A method according to claim 18, further comprising storing the data read from the solid state image sensor.

20. A method according to claim 18, wherein the encoded data includes at least one of a color process code, a mask revision code, a product code, a start code and an end code.

21. A solid state image sensor system comprising:

an array of pixels comprising a plurality of border pixels;

said plurality of border pixels having data encoded therein by color processing.

22. A solid state image sensor system according to claim 21, wherein said array of pixels comprises a color filter mosaic encoding the data.

23. A solid state image sensor system according to claim 22, wherein said color filter mosaic comprises color filter material on selected border pixels.

24. A solid state image sensor system according to claim 22, wherein said color filter mosaic comprises a plurality of color filter layers on selected border pixels.

25. A solid state image sensor system according to claim 22, wherein said color filter mosaic comprises a Bayer pattern color filter mosaic having a pattern comprising one encoded bit of binary data in two adjacent blocks of four pixels.

26. A solid state image sensor system according to claim 21, wherein said array of pixels comprises a microlens array encoding the data.

27. A solid state image sensor system according to claim 21, wherein the encoded data includes at least one of a color process code, a mask revision code, a product code, a start code and an end code.

28. A solid state image sensor system according to claim 21, further comprising a processor for processing the encoded data read from said plurality of border pixels.

29. A solid state image sensor system according to claim 21, further comprising a memory for storing the encoded data read from said plurality of border pixels.

* * * * *